United States Patent
Park

(10) Patent No.: US 9,214,366 B2
(45) Date of Patent: Dec. 15, 2015

(54) APPARATUS FOR TREATING SUBSTRATE BY APPLYING CHEMICAL SOLUTION ON SUBSTRATE USING PLURAL ROLLERS

(75) Inventor: Ho youn Park, Suwon-si (KR)

(73) Assignee: DMS CO., LTD., Hwaseong-si, Gyeonggi-do (KR)

( * ) Notice: Subject to any disclaimer, the term of this patent is extended or adjusted under 35 U.S.C. 154(b) by 720 days.

(21) Appl. No.: 13/554,231

(22) Filed: Jul. 20, 2012

(65) Prior Publication Data
US 2013/0019909 A1   Jan. 24, 2013

(30) Foreign Application Priority Data

Jul. 20, 2011   (KR) .................. 10-2011-0071932
Jul. 20, 2011   (KR) .................. 10-2011-0071933

(51) Int. Cl.
| | | |
|---|---|---|
| H01L 21/67 | (2006.01) | |
| B08B 13/00 | (2006.01) | |
| B08B 1/02 | (2006.01) | |
| H01L 21/677 | (2006.01) | |

(52) U.S. Cl.
CPC .... H01L 21/67057 (2013.01); H01L 21/67086 (2013.01); H01L 21/67706 (2013.01)

(58) Field of Classification Search
CPC ........ B05C 1/0813; B05C 1/10; B05C 1/083; B05C 5/0254; B05C 1/08; B05C 1/02; B05C 17/0308; B05C 1/0865; B05C 1/165; B05C 3/18; B05C 11/00; B05C 11/10; B05C 11/1039; B05C 11/11; H01L 21/67046; H01L 21/67057; H01L 21/677075; H01L 21/67086

USPC ......... 118/258, 500, 264, 423, 719, 244, 428, 118/400, 412, 602
See application file for complete search history.

(56) References Cited

U.S. PATENT DOCUMENTS 5,075,128 A * 12/1991 Gnuechtel et al. ................. 427/8
5,879,738 A *  3/1999 McKinnon et al. .......... 427/96.8
(Continued)

FOREIGN PATENT DOCUMENTS

| JP | 2003-289036 A | 10/2003 |
|---|---|---|
| JP | 2006-196783 A | 7/2006 |
| JP | 2006-245221 A | 9/2006 |
| JP | 2004-363200 A | 12/2009 |

(Continued)

OTHER PUBLICATIONS

English Machine Translation of Description of JP2004363200A (Tomifuji et al. Dec. 2004).*

*Primary Examiner* — David Cormier
*Assistant Examiner* — Irina Graf
(74) *Attorney, Agent, or Firm* — Paratus Law Group, PLLC

(57) ABSTRACT

An apparatus for treating a substrate including a plurality of transfer rollers configured to transfer a substrate and simultaneously to be rotated to wet a back surface of the substrate; a plurality of chemical solution supply tanks configured to receive the chemical solution therein, the plurality of the chemical solution supply tanks arranged under the plurality of the transfer rollers, respectively, with being spaced apart a predetermined distance from each other; a main tank configured to surround the plurality of the chemical solution supply tanks; and an exhaustion unit configured to suck and exhaust fume generated in the process of wetting the back surface with the chemical solution and liquid drops of the chemical solution.

19 Claims, 12 Drawing Sheets

(56) References Cited

U.S. PATENT DOCUMENTS

| | | | |
|---|---|---|---|
| 2002/0066468 A1* | 6/2002 | Vail et al. | 134/6 |
| 2005/0011537 A1* | 1/2005 | Toshima et al. | 134/19 |
| 2006/0045981 A1* | 3/2006 | Tsushi et al. | 427/428.01 |
| 2006/0081176 A1* | 4/2006 | Boyle et al. | 118/258 |
| 2008/0237188 A1* | 10/2008 | Kajino et al. | 216/93 |
| 2012/0255488 A1* | 10/2012 | Rebstock et al. | 118/255 |

FOREIGN PATENT DOCUMENTS

| | | |
|---|---|---|
| JP | 2011-100872 A | 5/2011 |
| KR | 10-0699336 B1 | 3/2007 |
| KR | 10-2008-0082642 | 9/2008 |
| KR | 10-2008-0093974 | 10/2008 |
| KR | 10-2009-0124519 A | 12/2009 |
| WO | WO 2010116442 A1 * | 10/2010 |

* cited by examiner

APPARATUS FOR TREATING SUBSTRATE BY APPLYING CHEMICAL SOLUTION ON SUBSTRATE USING PLURAL ROLLERS

CROSS-REFERENCE TO RELATED APPLICATION

This application claims priority under 35 U.S.C. §119 from Korean Application Nos. 10-2011-0071932 and 10-2011-0071933 filed Jul. 20, 2011, the subject matter of which is incorporated herein by reference.

BACKGROUND

1. Field

Embodiments of the present invention relates to an apparatus for treating a substrate, more particularly, to an apparatus for treating a substrate that is able to perform treating with respect to a predetermined surface of a substrate and to reduce usage of chemical solution for the surface treating of the substrate.

2. Background

Generally, a developing solution (developer), an etching solution, a stripping solution (stripper), a cleaner and the like are supplied to a surface of a substrate to perform surface treatment for developing, etching, stripping, cleaning and the like.

Especially, when a treatment solution is supplied only to a specific surface of the substrate to remove a coating layer coated on a substrate, the surface of the substrate is typically wet by direct contact with a roller stained with the treatment solution, using a surface tension of the treatment solution.

Such a typically method is disclosed in Korean Patent No. 10-2008-0082642 and No. 10-2008-0093974.

An apparatus for treating a substrate disclosed in Korean Patent No. 10-2008-0082642 and No. 10-2008-0093974 includes a plurality of transfer rollers for transferring a substrate, absorption means arranged between each two of the transfer rollers, and one tank containing a treatment solution, having the transfer rollers arranged thereon.

However, according to the conventional apparatus for treating the substrate, the auxiliary absorption means are installed between the transfer rollers and a volume of the tank cannot help but increase. Accordingly, the conventional apparatus has a disadvantage of the increased capacity of the treatment solution contained in the tank.

In addition, a hole type suction opening is formed in the auxiliary suction means installed between the transfer rollers and a connection pipe has to be provided to connect the suction means with each other. Accordingly, there is another disadvantage of the complex exhaustion structure for exhausting both fume generated in the surface treating process of the substrate and liquid-drops of the treatment solution.

Especially, the fume and liquid-drops not located near the hole type suction opening fail to be absorbed via the suction opening, such that exhaustion efficiency may be deteriorated.

Moreover, the suction opening of the suction means has to be positioned higher than a water level of the treatment solution contained in the tank. However, when a large amount of the treatment solution is supplied to the inside of the tank via one medium line installed under the tank, a flux within the tank might be insecure and the treatment solution located between neighboring transfer rollers might be shaking. Because of that, the treatment solution might be sucked via the suction opening and there might be a problem of a damaged suction fan.

As a result, the fume and the liquid-drop fail to be sucked via the hole type suction opening perfectly or the treatment solution happens to be sucked into the suction opening. If the fume and the liquid-drops are remaining near the substrate, surfaces except a back surface of the substrate might be corroded.

SUMMARY

Accordingly, the embodiments of the present invention may be directed to an apparatus for treating a surface of a substrate. To solve the problems, an object of the present invention may be to provide an apparatus which is able to perform surface-treatment with respect to a substrate stably.

Another object of the present invention is to an apparatus for treating a surface of a substrate which is able to reduce the amount of treatment solution used in the surface treatment of the substrate.

A further object of the present invention is to an apparatus for treating a surface of a substrate which includes a simple exhaustion structure configured to suck and exhaust the fume and liquid-drops generated in a surface treatment process.

To achieve these objects and other advantages and in accordance with the purpose of the embodiments, as embodied and broadly described herein, an apparatus for treating a substrate includes a plurality of transfer rollers configured to be rotated in order to transfer a substrate and simultaneously to wet a back surface of the substrate; a plurality of chemical solution supply tanks configured to receive the chemical solution therein, the plurality of the chemical solution supply tanks arranged under the plurality of the transfer rollers, respectively, with being spaced apart a predetermined distance from each other; a main tank configured to surround the plurality of the chemical solution supply tanks; and an exhaustion unit configured to suck and exhaust fume generated in the process of wetting the back surface with the chemical solution and liquid drops of the chemical solution.

The exhaustion unit may include a suction pipe that is open within the main tank, and the suction pipe sucks the fume and the liquid drops via a space formed between each two neighboring chemical solution supply tanks.

The apparatus for treating the substrate may further include a front tank installed adjacent to a side of the main tank; and a chemical solution supply unit configured to supply the chemical solution to the front tank.

The apparatus for treating the may further include a rear tank installed adjacent to the other side of the main tank; and a first chemical solution exhaustion unit configured to exhaust the chemical solution supplied to the rear tank outside.

The apparatus for treating the substrate may further include a water level sensing unit arranged in the front tank to sense a water level within the chemical solution supply tanks.

The apparatus for treating the substrate may further include a driving unit configured to rotate the transfer rollers, the driving unit coupled to a shaft of the transfer rollers formed through the front tank along a longitudinal direction of the transfer rollers.

The apparatus for treating the substrate may further include a sealing member arranged between the front tank and the driving unit to prevent the chemical solution from leaking to the driving unit.

A first bearing may be provided between a first front lateral wall of the front tank arranged along a longitudinal direction of the shaft and the shaft, and a second bearing may be provided between a second front lateral wall of the front tank and the shaft.

The chemical solution supply tanks, the main tank, the front tank and the rear tank may be integrally formed with each other.

The apparatus for treating the substrate may further include a second chemical solution exhaustion unit arranged under the main tank to exhaust the chemical solution drawn into the main tank after overflowing along a cross sectional direction of the chemical solution supply tanks.

A plurality of chemical solution supply holes may be formed in the front tank, in communication with the plurality of the chemical solution supply tanks, respectively.

A plurality of chemical solution passages may be formed in the rear tank to flow the chemical solution overflowing along longitudinal directions of the chemical solution supply tanks there though.

The transfer roller may include a roller body received in the chemical solution supply tank, in contact with the back surface of the substrate, and a shaft comprising a first shaft portion and a second shaft portion provided in both ends of the roller body to rotate the roller body, and the first shaft portion may include a first hollow shaft region arranged outside the chemical solution supply tank, with a hollow shape, and a first chemical solution inlet is formed in the first hollow shaft region to supply the chemical solution to the chemical solution supply tank.

A body hollow portion may be formed in the roller body, in communication with the first hollow shaft region, and a plurality of body communication holes may be formed in an outer surface of the roller body to connect the outer surface and the body hollow portion with each other.

The second shaft portion may include a third hollow shaft region arranged outside the chemical solution supply tank, in communication with the body hollow portion, and a first chemical solution outlet may be formed in the third hollow shaft region to exhaust the chemical solution from the chemical solution supply tank.

The apparatus for treating the substrate may further include a third shaft portion extended from the first and second shaft portions, passing through the roller body, the third shaft portion formed in hollow shape, and a first communication hole in communication with the roller body may be formed in the third shaft portion and a second communication hole in communication with the chemical solution supply tank is formed in an outer surface of the roller body.

The roller body may have a cylindrical shape and one or more roller partition walls may be installed in the roller body to reinforce the rigidity of the roller body.

The first shaft portion may include a second hollow shaft region arranged in the chemical solution supply tank, with a hollow shape, and a second chemical solution inlet in communication with the chemical solution supply tank is formed in the second hollow shaft region and the roller body has a solid shaft shape.

In another aspect of the present invention, an apparatus for treating a substrate includes a plurality of transfer rollers configured to be rotated in order to transfer a substrate and simultaneously to wet a back surface of the substrate; a plurality of chemical solution supply tanks configured to receive the chemical solution therein, the plurality of the chemical solution supply tanks arranged under the plurality of the transfer rollers, respectively, with being spaced apart a predetermined distance from each other; a main tank configured to surround the plurality of the chemical solution supply tanks; a front tank adjacent to a side of the main tank; and a chemical solution supply unit configured to supply the chemical solution to the front tank, wherein the front tank and the chemical solution supply tanks are in communication with each other.

The transfer roller may include a roller body received in the chemical solution supply tank, in contact with the back surface of the substrate and a shaft configured to rotate the roller body, and at least predetermined portion of the shaft is formed in a hollow shape to make the front tank in communication with the chemical solution supply tank.

It is to be understood that both the foregoing general description and the following detailed description of the embodiments or arrangements are exemplary and explanatory and are intended to provide further explanation of the embodiments as claimed.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
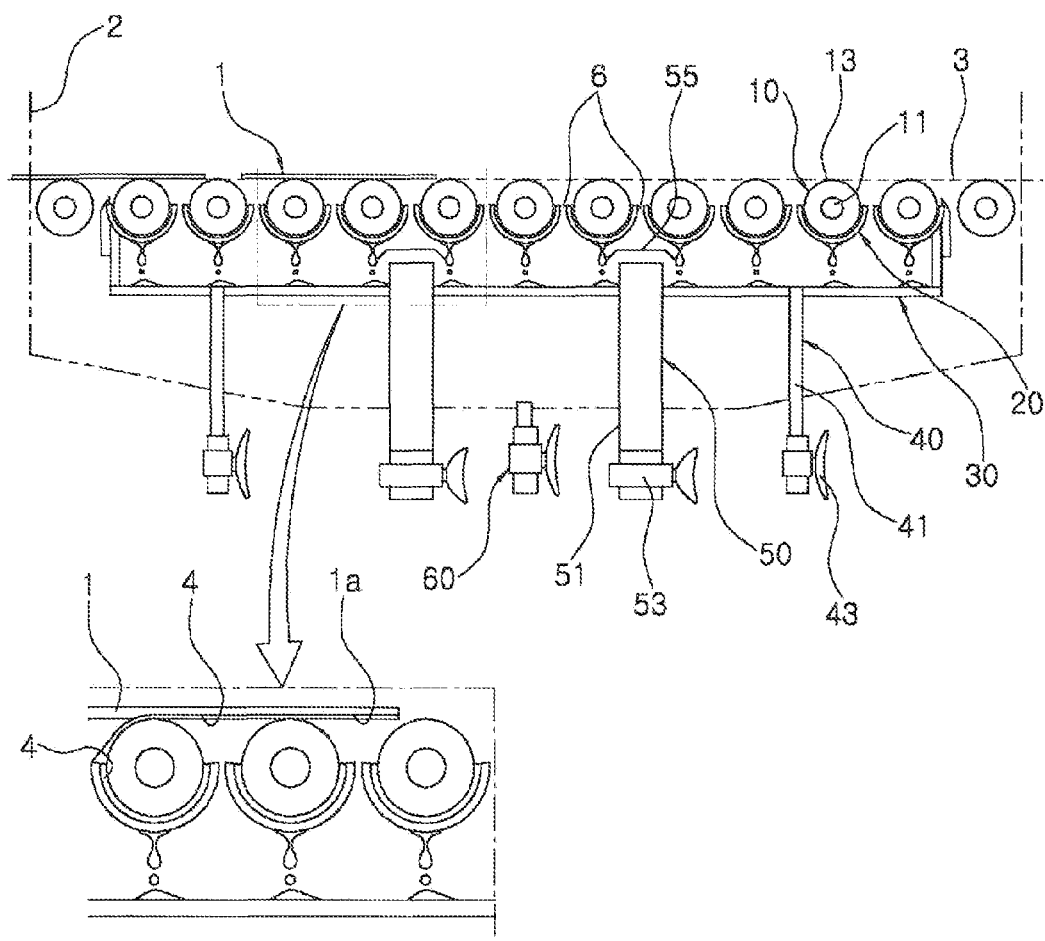
FIG. 1 is a longitudinal sectional view of an apparatus for treating a substrate according to a first embodiment of the present invention.
Figure 2:
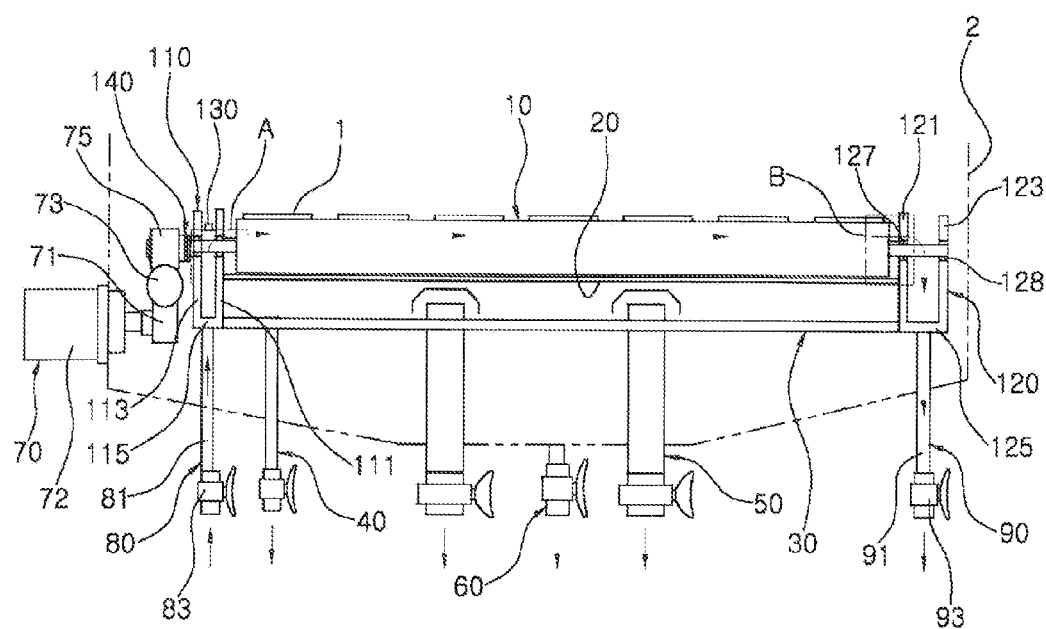
FIG. 2 is a cross sectional view of the apparatus for treating the substrate shown in FIG. 1.
Figure 3:
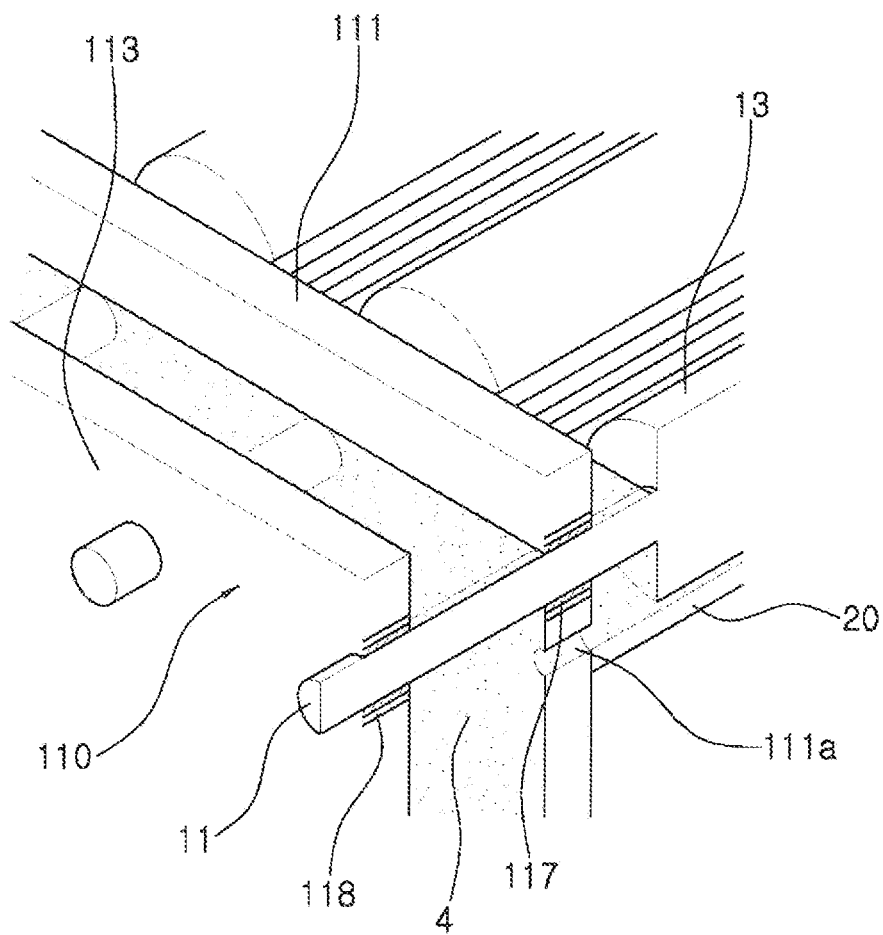
FIG. 3 is an enlarged perspective view of 'A' shown in FIG. 2.
Figure 4:
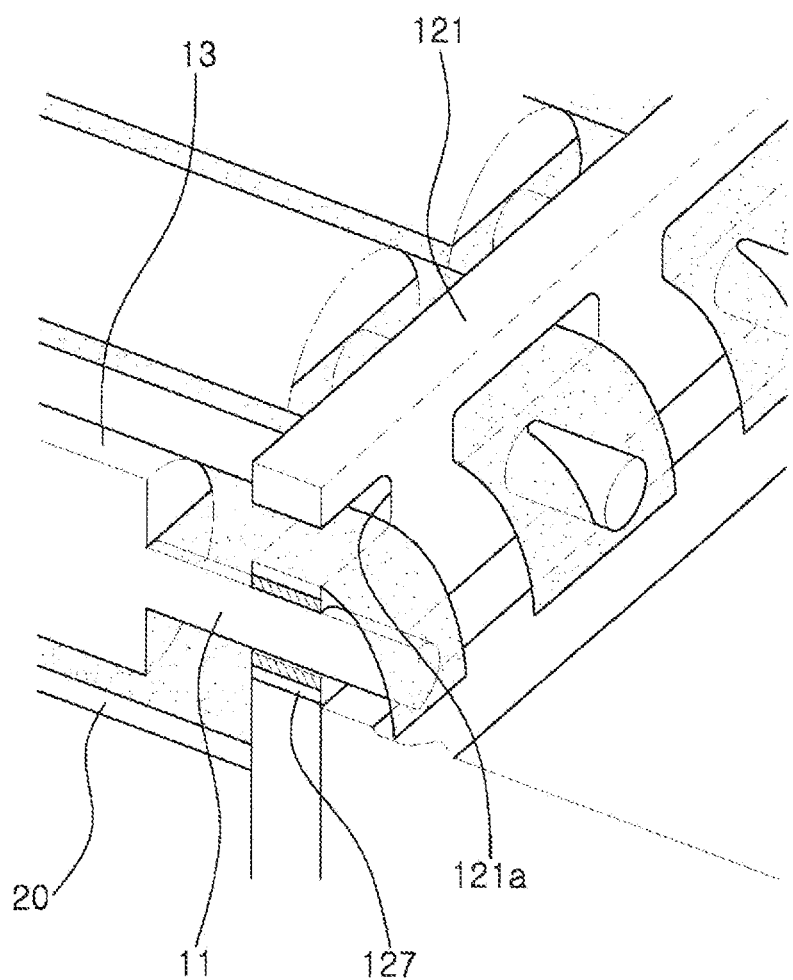
FIG. 4 is an enlarged perspective view of 'B' shown in FIG. 2.
Figure 5:
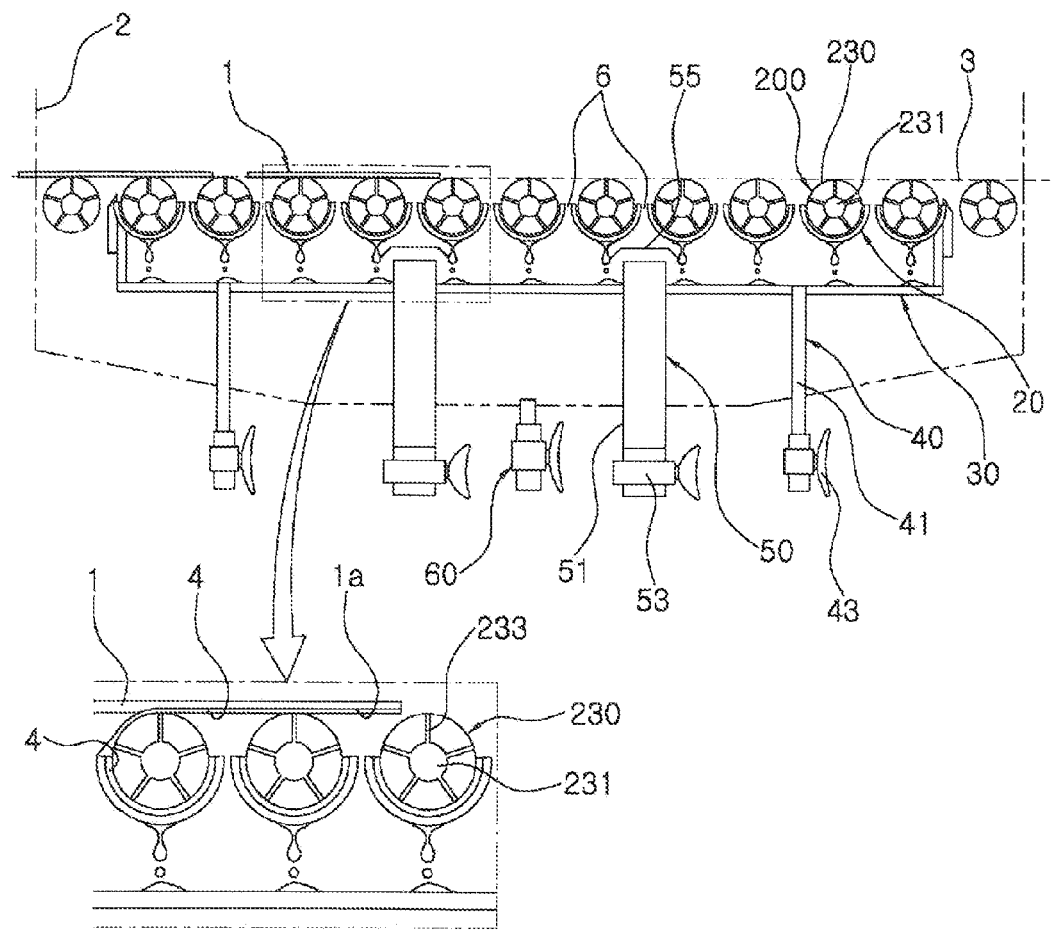
FIG. 5 is a longitudinally sectional view of an apparatus for treating a substrate according to a second embodiment of the present invention.
Figure 6:
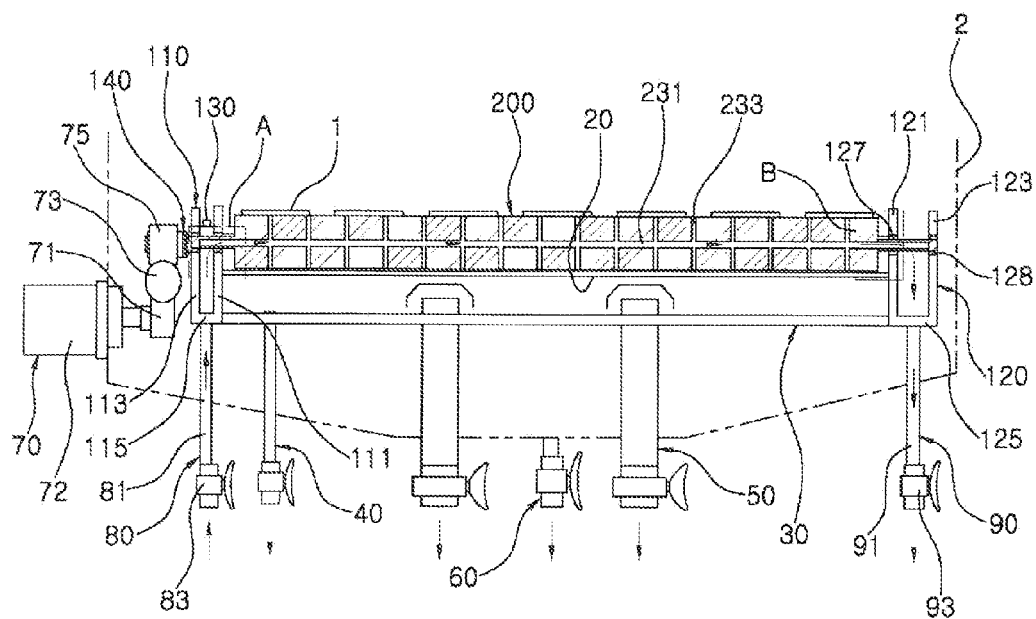
FIG. 6 is a cross sectional view of the apparatus for treating the substrate shown in FIG. 5.
Figure 7:
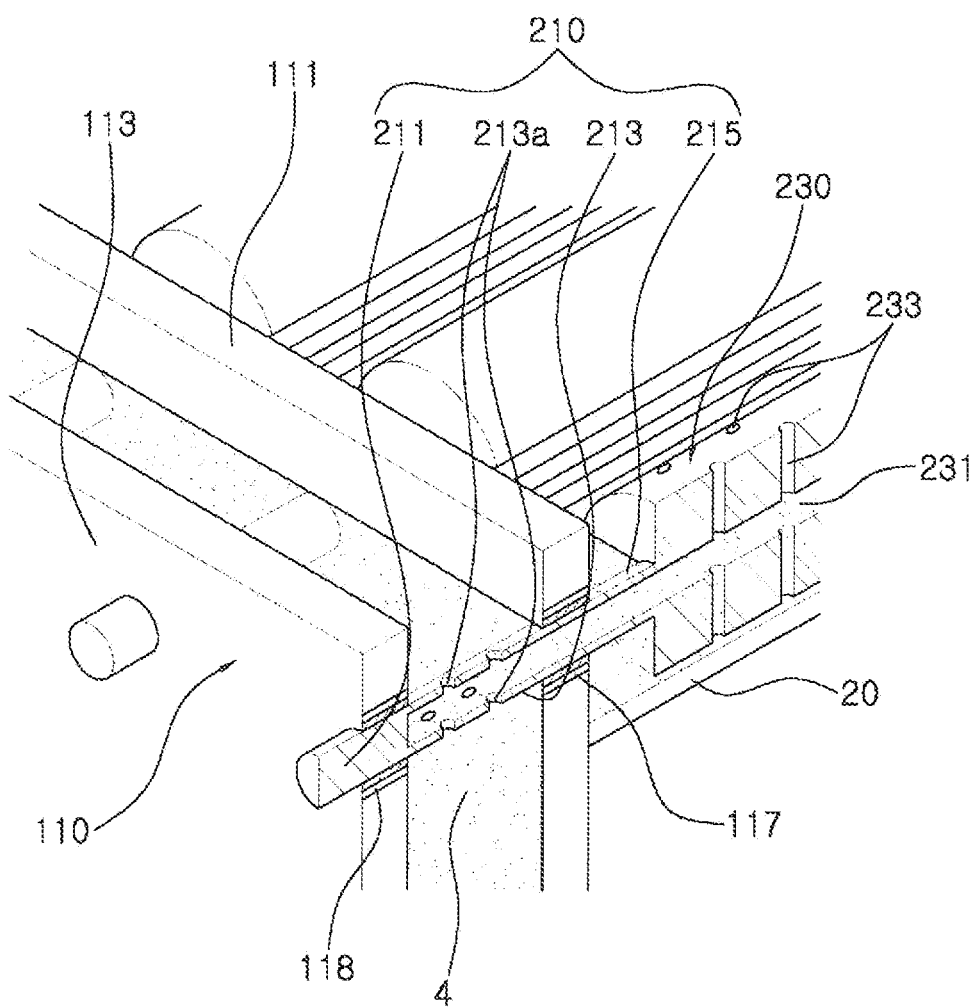
FIG. 7 is an enlarged perspective view of 'A' shown in FIG. 6.
Figure 8:
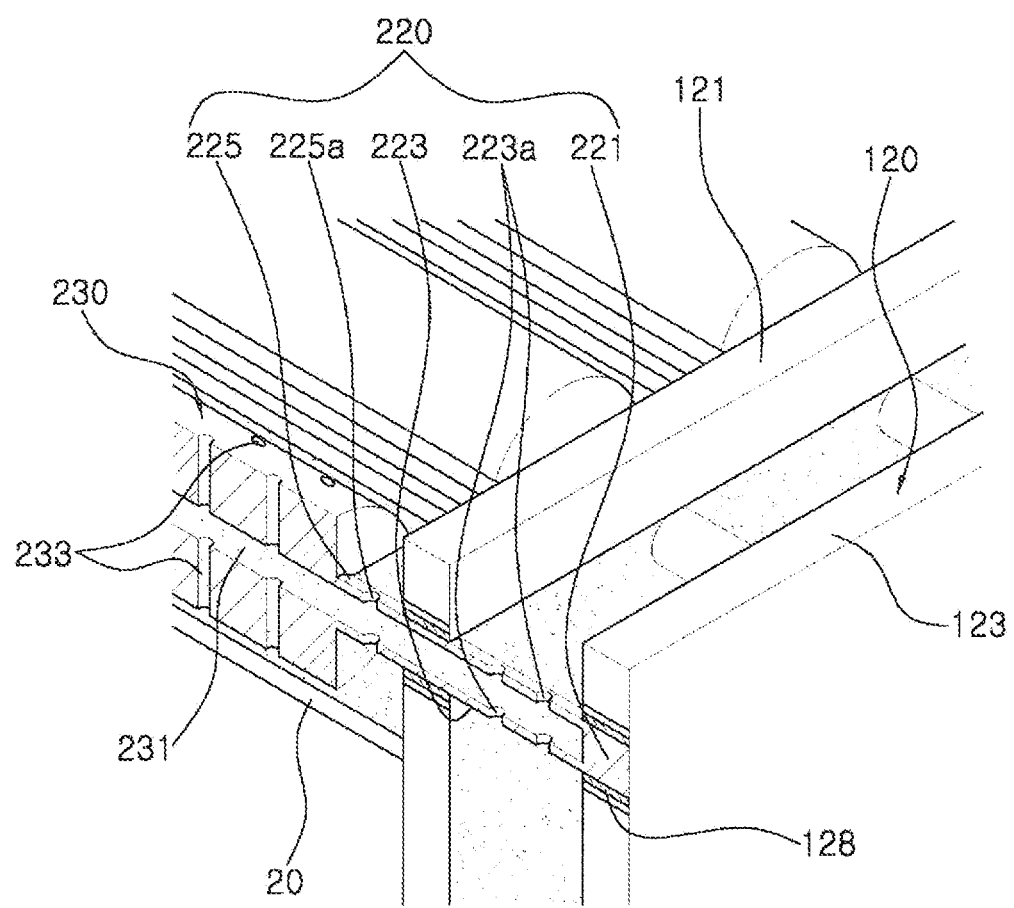
FIG. 8 is an enlarged perspective view of 'B' shown in FIG. 6.

Reference may now be made in detail to specific embodiments, examples of which may be illustrated in the accompanying drawings. Wherever possible, same reference numbers may be used throughout the drawings to refer to the same or like parts.

Referring to FIGS. 1 to 4, an apparatus for treating a substrate (hereinafter, a substrate treating apparatus) according to a first embodiment includes a plurality of transfer rollers 10, a plurality of chemical solution supply tanks 20, a main tank 30, an exhaustion unit 50, a front tank 110, a rear tank 120, a chemical solution supply unit 80, a first solution exhaustion unit 90, a driving unit 70 and a second solution exhaustion unit 40.

The plurality of the transfer rollers 10 may be configured to transfer a substrate 1 and simultaneously to make a back surface 1a of the substrate wet with a chemical solution 4, in direct contact with a back surface 1a.

Specifically, a transfer roller 10 includes a roller body 13 and a shaft 11 integrally formed with the roller body 13. The shaft 11 is rotated in a state of placing the substrate 1 on an upper surface of the roller body 13, to transfer the substrate 1. In this instance, the upper surface of the roller body 13 and the back surface 1a of the substrate are in direct contact with each other, to form a transfer plane surface 3 on which the substrate 1 is transferred.

In this instance, the solution 4 is wet on a surface of the roller body 13 and the back surface 1a of the substrate is wet with the solution 4 accordingly.

The chemical solution 4 is contained in a plurality of chemical solution tanks 20 corresponding to the plurality of the transfer rollers 10. In addition, the transfer roller 10 is arranged on a corresponding chemical solution tank 20 to make the upper surface of the roller body 13 higher than an upper surface of a corresponding chemical solution tank 20.

Accordingly, when the transfer roller 10 is rotated, the chemical solution 4 wet on the surface of the roller body 13 is transferred to the back surface 1a of the substrate in contact with the upper surface of the roller body 13.

To transfer the chemical solution 4 to the back surface 1a of the substrate efficiently, the surface of the roller body 13 may have a hydrophilic finish. Also, a plurality of recesses or holes may be formed in the surface of the roller body 13. An auxiliary coated layer having hygroscopicity may be provided on the surface of the roller body 13.

The present invention is not limited to the embodiment mentioned above and the roller body 13 may have a hollow cylindrical shape and the shaft 11 may be a hollow shaft having an empty inside.

Meanwhile, the chemical solution tanks 20 are installed under the chemical solution supply tanks, respectively, and they are spaced apart a predetermined distance from each other. The appearance of the chemical solution supply tank 20 may be substantially similar to a bucket having a top open longitudinally with respect to the chemical solution supply tank 20.

No auxiliary elements are installed between each two of the chemical solution tanks 20. A predetermined amount of chemical solution 4 enough to wet the surface of the roller body 13 is supplied to the chemical solution tank 20. Accordingly, the usage of the chemical solution 4 can be minimized.

The transfer roller 10 is installed above the corresponding chemical solution supply tank 20, separately from the other transfer rollers 20. Accordingly, even if a neighboring transfer roller is rotated irregularly, the chemical solution contained in the corresponding chemical solution supply tank 20 may not shake and the chemical solution 4 may be stably supplied to the corresponding transfer roller.

Meanwhile, the main tank 30 may surround lateral surfaces and back surfaces of the chemical solution supply tanks 20. Accordingly, the plurality of the bucket-shaped chemical solution supply tanks 20 may be installed on the main tank 30.

Of course, the present invention is not limited to the embodiment mentioned above and the main tank 30 and the plurality of the chemical solution supply tanks 20 may be integrally formed with each other. When the main tank 30 and the chemical solution supply tanks 20 are integrally formed with each other, a top surface of the main tank 30 is covered by the plurality of the chemical solution tanks 20 and a slit-shape formed longitudinally along the chemical solution supply tanks 20 is formed between each two of the chemical solution supply tanks 20.

Alternatively, all of the chemical solution tanks 20, the main tank 30, the front tank 110 and the rear tank 120 may be integrally formed.

The exhaustion unit 50 may suck and exhaust the fume generated during the process of wetting the back surface 1a of the substrate with the chemical solution 4 and the liquid-drop of the chemical solution 4. If the exhaustion of the fume and the liquid-drops is not performed completely, the fume and the liquid-drop might react with the surfaces, except the back surface 1a of the substrate, in other words, the surfaces supposed not to be corroded.

The exhaustion unit 50 includes a suction pipe 51 that is open in the main tank 30, passing through a bottom surface of the main tank 30, a suction guide 55 arranged in an upper end of the suction pipe 51, an exhaustion amount adjusting valve 53 for adjusting the exhaustion amount of the fume and the liquid-drops sucked from the suction pipe 51, and an exhaustion fan (not shown) in communication with the suction pipe 51.

The suction pipe 51 may be projected from the bottom surface of the main tank 30 a predetermined height and an upper end of the suction pipe 51 is positioned under the plurality of the chemical solution supply tanks 20.

When the exhaustion fan is driven, the suction pipe 51 sucks the fume and the liquid-drops via a predetermined space 6 formed between lower portions of each two neighboring chemical solution supply tanks 20. In this instance, the space 6 is employed as a slit formed between two neighboring chemical solution supply tanks 20.

As a result, when the exhaustion unit 50 sucks and exhausts the fume and the liquid-drops, the fume and the liquid-drops existing near the back surface 1a of the substrate can be sucked and exhausted perfectly even with no pipes for physically connecting the suction pipe 51 with the space 6. Accordingly, the structure for sucking and exhausting the fume and the liquid-drops may be simplified and only the back surface 1a of the substrate desired to treat may be stably treated.

The present invention may not be limited to the embodiment mentioned above and the suction pipe 51 may be formed through a lateral wall of the main tank 30 to communicate with an external exhaustion fan. The suction guide 55 installed in the upper end of the suction pipe 51 may be arranged at a predetermined angle with respect to the suction pipe 51, to suck the fume and the liquid-drops.

Meanwhile, the front tank 110 may be installed adjacent to the main tank 30, in communication with the chemical solution supply tanks 20, such that it may supply the chemical solution 4 to the chemical solution supply tanks 20.

Specifically, the front tank 110 includes a front lateral wall, a front bottom wall 115 and a front upper tank. The front lateral wall includes a first front lateral wall 111 having the shaft 11 passing there through along the longitudinal direction of the transfer roller 10, a second front lateral wall 113 spaced apart a predetermined distance from the first front lateral wall, a third front lateral wall (not shown) for connecting the first and second front lateral walls 111 and 113 with each other, and a fourth front lateral surface (not shown).

A plurality of chemical solution supply holes 111a may be formed in the first front lateral wall 111, in communication with the plurality of the chemical solution supply tanks 20, respectively. The chemical solution supply holes 111a may communicate with bottom surfaces of the chemical solution supply tanks 20, respectively. That is because the transferring of the chemical solution 4 to the back surface 1a of the substrate has not to be interfered.

Also, the chemical solution supply unit 80 is installed under the front bottom wall 115 to supply the chemical solution to the front tank 110.

The chemical solution supply unit 80 includes a supply pipe 81 in communication with the front tank 110 and a supply amount adjusting valve 83 for adjusting the amount of the chemical solution 4 supplied via the supply pipe 81.

Accordingly, when the chemical solution 4 is supplied to the front tank 110 by the chemical solution supply unit 80, the chemical solution 4 is drawn into the chemical solution supply tank 20 via the chemical solution supply hole 111*a* of the front lateral wall 111.

A water level sensing unit 130 is arranged in the front tank 110 to sense a water level of the chemical solution supply tank 20. The chemical solution supply tank 20 and the front tank 110 are in communication with each other by the chemical solution supply holes 111*a*, such that they may have the same water level.

As a result, when checking the level of the chemical solution 4 within the front tank 110, the level of the chemical solution 4 within the chemical solution supply tank 20 may be checked. The water level sensing unit 130 may be a proximity sensor or a floating sensor.

The amount of the chemical solution 4 supplied from the chemical solution supply unit 80 may be adjusted based on the water level sensed by the water level sensing unit 130.

The present invention is not limited to the embodiment mentioned above. The amount of the chemical solution 4 exhausted from the main tank 30 and the rear tank 120 is checked on a real-time basis and the amount of the chemical solution corresponding to the exhaustion amount may be supplied to the front tank 110 from the chemical solution supply unit 80.

Meanwhile, the driving unit 70 is configured to rotate the transfer roller 10 and it is coupled to the shaft 11 of the transfer roller 10. The shaft 11 is formed through the front tank 110 along a longitudinal direction of the transfer roller 10.

The driving unit 70 includes a driving motor 72, a main-rotary member 71, a sub-rotary member 75 coupled to the shaft 11 and a power transmitting member 73 for connecting the main rotary member 71 with the sub-rotary member 75.

Of course, the present invention is not limited to the embodiment mentioned above. Alternatively, the main rotary member 71 is directly coupled to the shaft 11 and the main rotary member 71 is directly gear-connected with the sub-rotary member 75.

One driving motor may be used in rotating one transfer roller. Alternatively, one driving motor or one power transmitting member rotate the plurality of the transfer rollers at one time.

A first bearing 117 may be installed between the first front lateral wall 111 and the shaft 11. A second bearing 118 may be installed between the second front lateral wall 113 and the shaft 11.

Accordingly, even when the driving unit 70 is arranged outside the front tank 110, the shaft 11 may be rotated stably by the support of the first bearing 117 and the second bearing 118.

A sealing member 140 may be installed between the front tank 110 and the driving unit 70. The sealing member 140 is configured to prevent the chemical solution 4 from leaking and being transmitted to the driving unit 70.

Meanwhile, the rear tank 120 is installed next to the other side of the main tank 110 to receive the chemical solution 4 overflowing along the longitudinal direction of each chemical solution supply tank 20.

The rear tank 120 includes a rear lateral wall, a rear bottom wall 125, and a rear upper wall. The rear lateral wall includes a first rear lateral wall 121 to pass the shaft there through along the longitudinal direction of the transfer roller 10, a second rear lateral wall 123 spaced apart a predetermined distance from the first rear lateral wall 121, a third rear lateral wall (not shown) to connect the first rear lateral wall 121 and the second rear lateral wall 123 with each other and a fourth rear lateral wall (not shown).

A plurality of chemical solution passages 121*a* in communication with the plurality of the chemical solution supply tanks 20, respectively, may be formed in the first rear lateral wall 121. A chemical solution passage 121*a* may be in communication with an upper end of a corresponding chemical solution supply tank 20. That is to draw the chemical solution exhausted from the chemical solution supply tank 20 toward the rear tank 120 after reacting with the back surface 1*a* of the substrate.

In addition, a first chemical solution exhaustion unit 90 is installed under the rear bottom wall 125 to exhaust the chemical solution out of the rear tank 120.

The first chemical solution exhaustion unit 90 includes a first exhaustion pipe 91 in communication with the rear tank 120 and a first exhaustion amount adjusting valve 93 configured to adjust the amount of the chemical solution 4 exhausted via the first exhaustion pipe 91.

Accordingly, when the chemical solution flowing from the chemical solution supply tanks 20 along the longitudinal direction of the chemical solution supply tanks 20 is drawn into the rear tank 120 via the chemical solution passage 121*a* of the first rear lateral wall 121, the chemical solution is exhausted by the first chemical solution exhaustion unit 90.

In addition, a third bearing 127 is installed between the first rear lateral wall 121 and the shaft 11. A fourth bearing 128 is installed between the second rear lateral wall 123 and the shaft 11.

Accordingly, even when the shaft is installed through the rear tank 120, the shaft 11 may be stably rotated by the support of the third and fourth bearings 127 and 128.

Meanwhile, a second chemical solution exhaustion unit 40 is installed under the main tank 30 to exhaust the chemical solution 4 drawn into the main tank 30 outside after overflowing along a cross sectional direction of the chemical solution supply tanks 20.

The second chemical solution exhaustion unit 40 includes a second exhaustion pipe 41 in communication with the main tank 30 and a second exhaustion amount adjusting valve 43 configured to adjust the amount of the chemical solution 4 exhausted via the second exhaustion pipe 41.

Accordingly, the chemical solution flowing along the cross sectional direction of the chemical solution supply tanks 20 is collected under the main tank 30, only to be exhausted outside via the second exhaustion pipe 41 in communication with the main tank 30.

In this instance, an inclined portion is formed in a bottom surface of the main tank 30 to collect the chemical solution therein within the main tank 30 and the second exhaustion pipe 41 may be installed in the inclined portion.

Meanwhile, the substrate treating apparatus includes a substrate treating chamber 2 installed outer to the front tank 110, the main tank 30 and the rear tank 120, and an exhaustion unit 60 configured to suck and exhaust a fluidal material and foreign substances within the substrate treating chamber 2.

Referring to FIGS. 1 to 4, the process of treating the back surface of the substrate in the substrate treating apparatus according to the present invention will be described as follows.

The substrate 1 is loaded on the top surface of the transfer roller 10 to make the back surface 1a of the substrate, which is desired to treat, toward a vertically downward direction.

After that, the transfer roller 10 starts to be rotated and it transfers the substrate 1. In this instance, the chemical solution 4 is painted on a surface of the roller body 13 and the back surface 1a of the substrate is wet with the chemical solution 4.

At the same time, the fume generated in the process of wetting the back surface 1a of the substrate and the liquid drops of the chemical solution may be sucked by the exhaustion unit 50 simultaneously, to be exhausted out of the main tank 30.

During the process of treating the back surface 1a of the substrate, the chemical solution 4 is continuously supplied to the chemical solution supply tanks 20 via the front tank 110 by the chemical solution supply unit 80. The chemical solution overflowing along the longitudinal direction of the chemical solution supply tanks 20 may be exhausted outside by the first chemical solution exhaustion unit 90, after drawn into the rear tank 120.

At the same time, the chemical solution overflowing along a cross sectional direction of the chemical solution supply tanks 20 is drawn into the main tank 30 and exhausted outside by the second chemical solution exhaustion unit 40 after that.

Referring to FIGS. 5 to 8, a substrate treating apparatus according to a second embodiment will be described.

The substrate treating apparatus according to this embodiment includes a transfer roller having a different structure from the structure of the transfer roller according to the embodiment mentioned above. Detailed description of the same structure and components of this embodiment as those of the first embodiment will be omitted as follows.

A transfer roller 200 according to this embodiment includes a roller body 230 received in the chemical solution supply tank 20, in contact with the back surface 1a of the substrate, and a shaft having a first shaft portion 210 and a second shaft portion 220 that are extended from both side ends of the roller body 230 to rotate the roller body 230.

A body hollow portion 231 is formed in the roller body 230, in communication with the first shaft portion 210 and the second shaft portion 220. A plurality of body communication holes 233 are formed in an outer surface of the roller body 230 to connect the outer surface and the body hollow portion 231 with each other.

The first shaft portion 210 includes a first solid shaft region 211 arranged in an area of the front tank where passes through the second front lateral wall 113, a first hollow shaft region 213 arranged between the first front lateral wall 111 and the second front lateral wall 113 of the front tank, and a second hollow shaft region 215 arranged between the first front lateral wall 111 and an end of the roller body 230.

The first hollow shaft region 213 is arranged outside the chemical solution supply tank 20 and a first chemical solution inlet 213a is formed in the first hollow shaft region 123 to supply the chemical solution 4 to the chemical solution supply tank 20 via the first hollow shaft region 213.

Accordingly, when the chemical solution 4 is supplied to the front tank 110, the chemical solution 4 is supplied to the first hollow shaft region 213 via the first chemical solution inlet 213a and to the body hollow portion 231 via the second hollow shaft region 215. After that, the chemical solution 4 supplied to the body hollow portion 231 is supplied to the chemical solution supply tanks 20 via the body communication holes 233.

The first chemical solution inlet 213a may be a hole or a slit.

The second shat portion 220 includes a second solid shaft region 221 arranged in an area of the rear tank that passes the through the second rear lateral wall 123, a third hollow shaft region 223 arranged between the first rear lateral wall 121 of the rear tank and the second rear lateral wall 123, and a fourth hollow shaft region 225 arranged between the first rear lateral wall 121 and the other end of the roller body 230.

The third hollow shaft region 223 is in communication with the fourth hollow shaft region 225 and the body hollow portion 231 and it is arranged outside the chemical solution supply tank 20. A first chemical solution outlet 223a is formed in the third hollow shaft region 223 to exhaust the chemical solution 4 to the rear tank 120 from the chemical solution supply tank 20.

A chemical solution inlet 225a is formed in the fourth hollow shaft region 225. The first chemical solution outlet 223a and the chemical solution inlet 225a may be holes or slits.

Meanwhile, the back surface 1a of the substrate is wet with the chemical solution 4 by the direct contact with the back surface 1a of the substrate simultaneously when the chemical solution 4 is supplied to the chemical solution supply tanks 20 and when the plurality of the transfer rollers 200 transfer the substrate 1.

Meanwhile, the first hollow shaft region 213 is arranged in the front tank 110 and the first chemical solution inlet 213a of the hollow shaft region is in communication with the front tank 110.

Accordingly, when it is supplied to the front tank 110 by the chemical solution supply unit 80, the chemical solution 4 is drawn into the first hollow shaft region 213 via the first chemical solution inlet 213a and it is drawn into the chemical solution supply tanks 20 via the second hollow shaft region 215 and the roller body 230.

Meanwhile, the driving unit 70 is configured to rotate the transfer rollers 200. The driving unit 70 is coupled to the first solid shaft region 211 passing through the front tank 110 along the longitudinal direction of the transfer rollers 200.

Meanwhile, the third hollow shaft region 223 is arranged in the rear tank 110 and the first chemical solution outlet 223a of the third hollow shaft region is in communication with the rear tank 120.

Accordingly, the chemical solution received is drawn into the rear tank 120 via the first chemical solution outlet 223a of the third hollow shaft region, after passing the fourth hollow shaft region 225. The chemical solution drawn into the rear tank 120 is exhausted outside by the first chemical solution exhaustion unit 90.

Referring to FIGS. 5 to 8, the process of treating the back surface of the substrate performed by the substrate treating apparatus according to the second embodiment will be described as follows.

The substrate 1 is loaded on the top surface of the transfer roller 200 to make the back surface 1 of the substrate, which is desired to treat, toward a vertically downward direction.

After that, the transfer roller 200 starts to rotate the transfer roller 10 and it transfers the substrate 1. In this instance, the chemical solution 4 is painted on a surface of the roller body 13 and the back surface 1a of the substrate is wet with the chemical solution 4.

At the same time, the fume generated in the process of wetting the back surface 1a of the substrate and the liquid drops of the chemical solution may be sucked by the exhaustion unit 50 simultaneously, to be exhausted out of the main tank 30.

During the surface treating process with respect to the back surface 1a of the substrate, the chemical solution 4 is supplied to the front tank 110 by the chemical solution supply unit 80 and then drawn into the first chemical solution inlet 213a in communication with the front tank 110. After that, the chemical solution is flowing along the first hollow shaft region 213 and then continuously supplied to the chemical solution supply tanks 20 via the roller body 230.

The chemical solution flowing along the longitudinal direction of the chemical solution supply tanks 20 passes through the fourth hollow shaft region 225 and the third hollow shaft region. After that, the chemical solution is drawn into the rear tank 120 via the first chemical solution outlet 223a and it is exhausted outside by the first chemical solution exhaustion unit 90.

At the same time, the chemical solution overflowing along a cross sectional direction of the chemical solution supply tanks 20 is drawn into the main tank 30 and exhausted outside by the second chemical solution exhaustion unit 40 after that.

Figure 9:
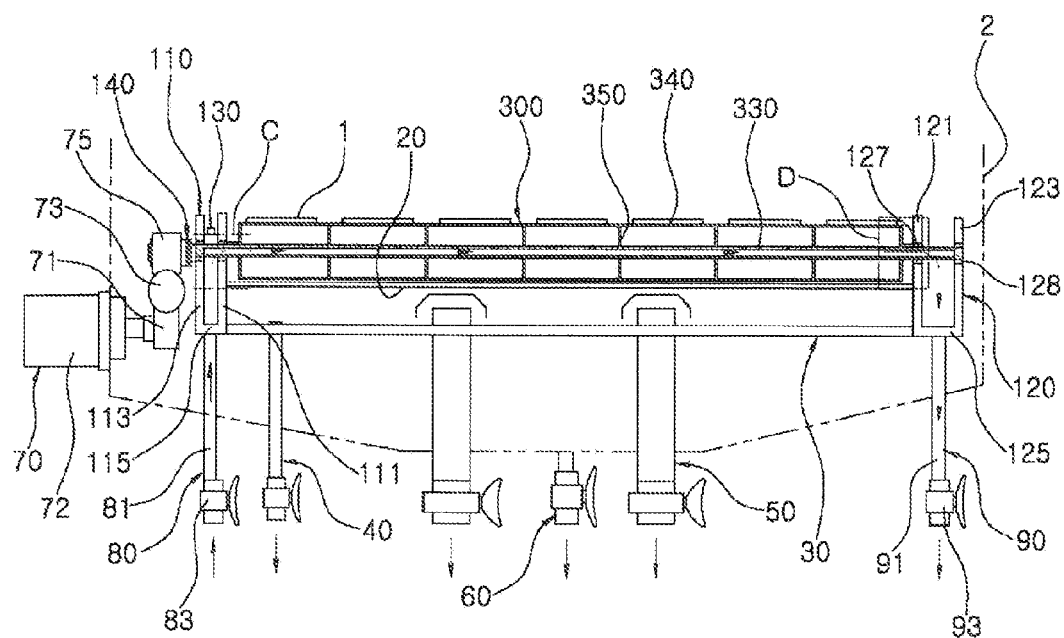
FIG. 9 is a cross sectional view of an apparatus for treating a substrate according to a third embodiment of the present invention.
Figure 10:
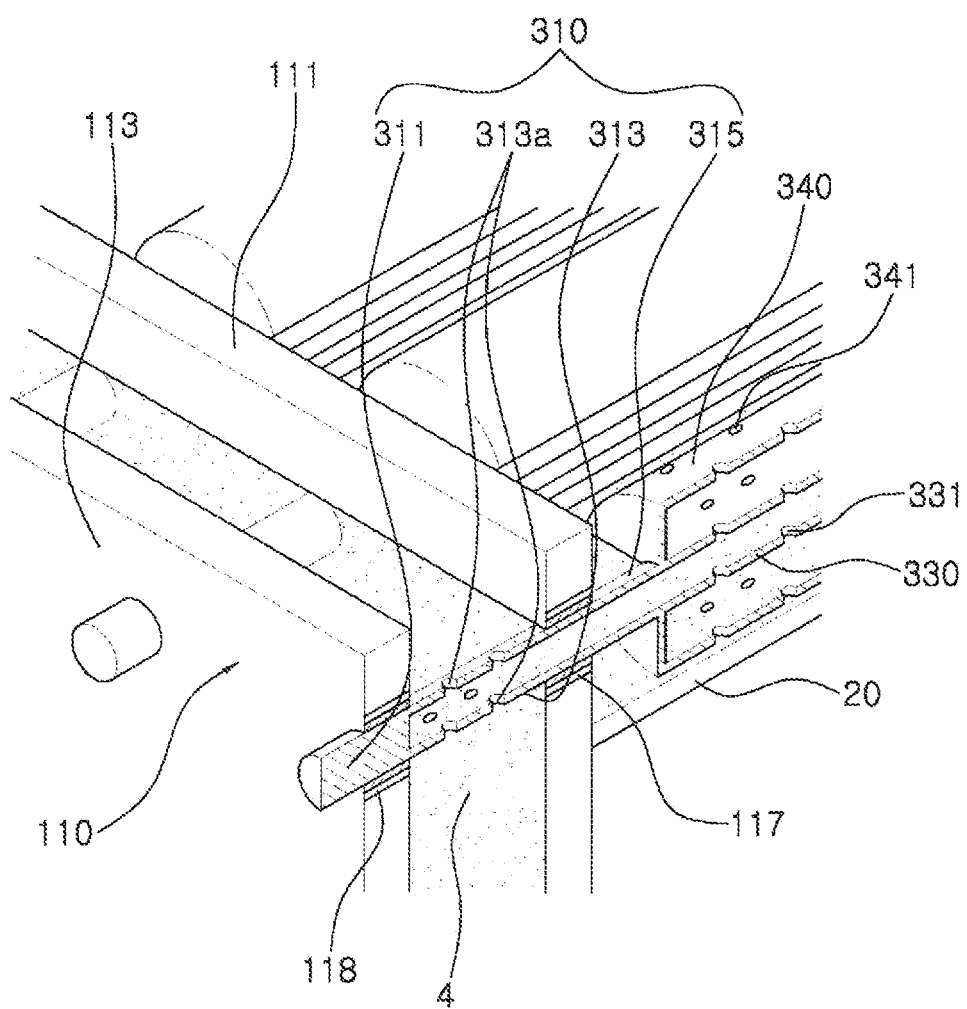
FIG. 10 is an enlarged perspective view of 'C' shown in FIG. 9.
Figure 11:
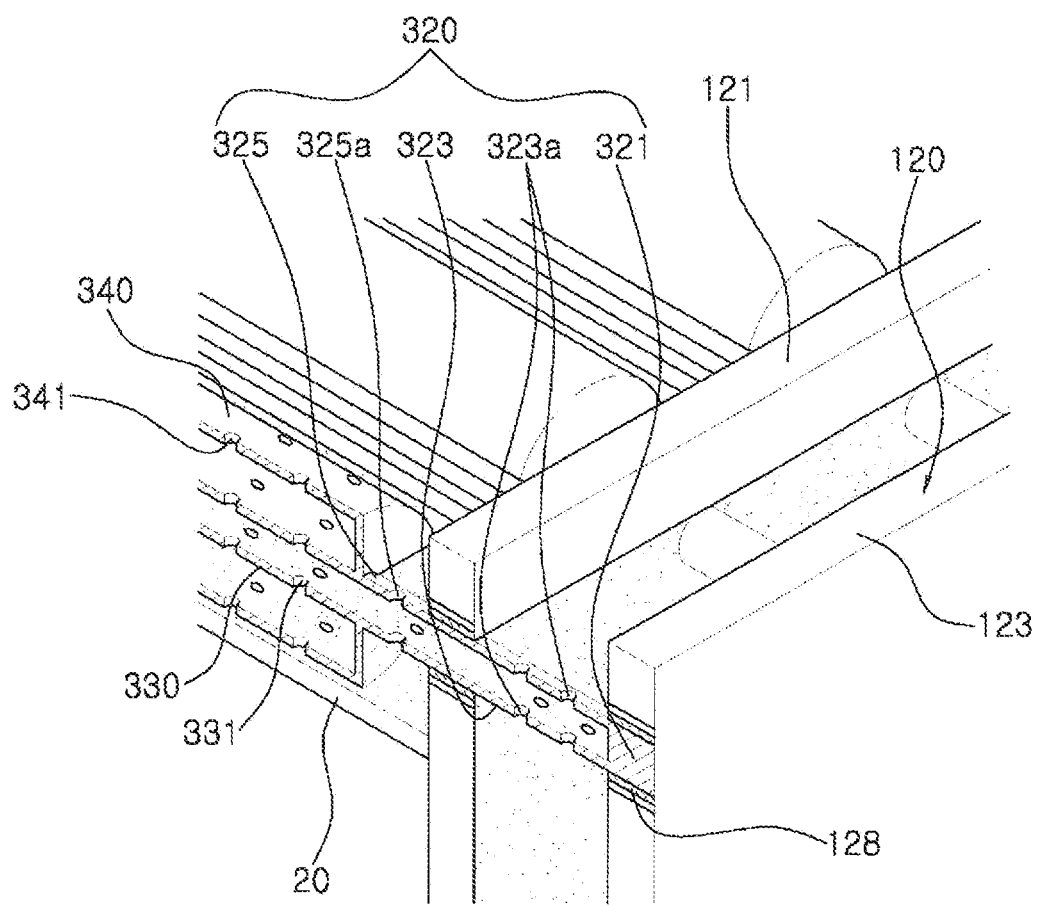
FIG. 11 is an enlarged perspective view of 'D' shown in FIG. 9.

Referring to FIGS. 9 to 11, a substrate treating apparatus according to a third embodiment of the present invention will be described.

The substrate treating apparatus according to this embodiment includes a transfer roller having a different structure from the structure of the transfer roller according to the first and second embodiments mentioned above. Detailed description of the same structure and components of this embodiment as those of the first and second embodiments will be omitted as follows.

A transfer roller 300 provided in the substrate treating apparatus according to this embodiment includes a roller body 340, a first shaft portion 310 extended from an end of the roller body 340, a second shaft portion 320 extended from the other end of the roller body 340, and a third shaft portion 330 extended from the first and second shaft portions 310 and 320 via the roller body 340, formed in a hollow shape.

The roller body 340 has a cylindrical shape and a second communication hole 341 is formed in an outer surface of the roller body 340 to communicate with the chemical solution supply tank 20.

In addition, one or more roller partition walls 350 may be arranged in the roller body 340 to reinforce the rigidity of the roller body 340, spaced apart a predetermined distance from each other. In this instance, the roller partition wall 350 supports the roller body 340 from an outer wall of the third shaft portion 330, while connecting inner walls of the roller body 340 with each other.

A first communication hole 331 in communication with the roller body 340 is formed in the third shaft portion 330. The structures of the first and second shaft portions 310 and 320 are substantially identical to the structures of the first shaft portion (210, see FIG. 7) and the second shaft portion (220, see FIG. 8), and detailed description of the identical structures will be omitted.

Accordingly, when the chemical solution is supplied to the front tank 110, the chemical solution is drawn into the first hollow shaft region 313 via a first chemical solution inlet 313a in communication with the front tank 110. The chemical solution drawn into the first hollow shaft region 313 is flowing along the first hollow shaft region 313 and it is drawn into the third shaft portion 330 via the second hollow shaft region 315.

The chemical solution 4 drawn into the third shaft portion 330 is flowing to the roller body 340 via the first communication hole 331 and the chemical solution drawn into the roller body 340 is flowing to the chemical solution supply tank 20 via the second communication hole 341.

After that, the chemical solution having wet the back surface 1a of the substrate passes the fourth hollow shaft region 325 and it is drawn into the rear tank 120 via a first chemical solution outlet 323a of the third hollow shaft region. The chemical solution drawn into the rear tank is exhausted outside by the first chemical solution exhaustion unit 90.

Simultaneously, the chemical solution overflowing along a cross sectional direction of the chemical solution supply tank 20 is exhausted outside by a second chemical solution 20, after drawn into the main tank 30.

Figure 12:
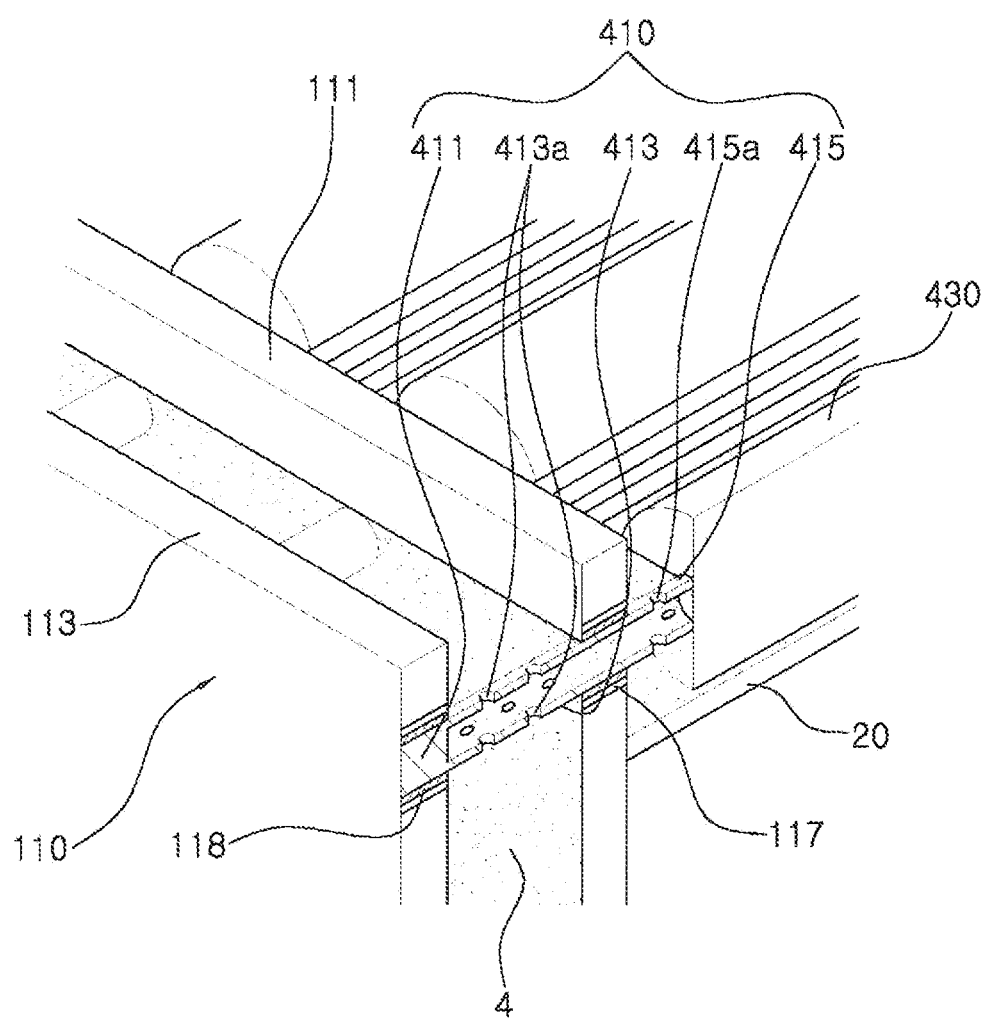
FIG. 12 is a perspective view illustrating a coupling structure between ends of transfer rollers provided in an apparatus for treating a substrate according to a fourth embodiment of the present invention.

Referring to FIG. 12, a substrate treating apparatus according to a fourth embodiment of the present invention will be described.

The substrate treating apparatus according to this embodiment includes a transfer roller having a different structure from the structure of the transfer roller according to the first, second and third embodiments mentioned above. Detailed description of the same structure and components of this embodiment as those of the first, second and third embodiments will be omitted as follows.

A transfer roller provided in the substrate treating apparatus according to this embodiment includes a roller body 430, a first shaft portion 410 extended from an end of the roller body 430 and a second shaft portion 420 extended from the other end of the roller body 430.

The roller body 430 has a cylindrical shape and specifically it is formed in a solid shaft shape. The second shaft portion 420 has a solid shaft shape and it is installed through a first rear lateral wall 121 of the rear tank.

The first shaft portion 410 includes a first solid shaft region 411 arranged in an rear of the front tank that passes through a second front lateral wall 113, a first hollow shaft region 413 arranged between a first front lateral wall 111 and a second front lateral wall 113 of the front tank, and a second hollow shaft region 415 arranged between the front lateral wall 111 and an end of the roller body 430.

The first hollow shaft region 413 is arranged outside the chemical solution supply tank 20. A first chemical solution inlet 413a is formed in the first hollow shaft region 413 to supply the chemical solution to the chemical solution tank 20 there though.

The second hollow shaft region 415 is arranged in the chemical solution supply tank 20 and a second chemical solution inlet 415a in communication with the chemical solution supply tank 20 is formed in the second hollow shaft region 415. The second chemical solution inlet 415a is a hole or a slit.

Accordingly, when it is supplied to the front tank 110, the chemical solution 4 is supplied to the first hollow shaft region 413 via the first chemical solution inlet 413a and it is ten flowing to the second hollow shaft region 415 in communication with the first hollow shaft region 413. After that, the chemical solution 4 is supplied to the chemical solution supply tank 20 via the second chemical solution inlet 415a formed in the second hollow shaft region 415.

Meanwhile, the connection structure between the rear tank 110 and the chemical solution supply tank provided in the substrate treating apparatus according to this embodiment is substantially identical to the structure according to the first embodiment mentioned above, and detailed description of the connection structure will be omitted accordingly.

The substrate treating apparatus according to the embodiments of the present invention has following effects.

First of all, the plurality of the chemical solution supply tanks are spaced apart a predetermine distance from each other, corresponding to the plurality of the transfer rollers. The fume generated during the treating process of the substrate and the liquid drops of the chemical solution are sucked and exhausted via the spaces formed between two neighboring of the chemical solution supply tanks, without any suction lines arranged between neighboring two of the transfer rollers. Accordingly, the exhaustion structure may be simplified.

Second, the plurality of the chemical solution supply tanks corresponding to the plurality of the transfer rollers, respectively, may be installed and the chemical solution supply tanks may be filled with only a predetermined amount of the chemical solution enough to wet the surfaces of the transfer rollers. Accordingly, the usage of the chemical solution may be reduced and the operation cost may be reduced.

Especially, the chemical solution may be supplied to the chemical solution supply tanks via the shafts of the transfer rollers. Accordingly, the supply structure of the chemical solution may be simplified and the usage of the chemical solution may be reduced as much as possible.

Third, the fume and the liquid drops are sucked and exhausted via the spaces formed between two neighboring ones of the chemical solution supply tanks. Accordingly, exhaustion efficiency may be enhanced. The other surfaces of the substrate, except the back surface, may not be corroded. Accordingly, the surface treatment with respect to the substrate may be performed stably.

Lastly, even when the plurality of the transfer rollers are rotated at different rotation numbers, respectively, the chemical solution received in the chemical solution supply tank may not be affected by the chemical solution received in the neighboring chemical solution supply tanks. Accordingly, the surface treatment with respect to the substrate may be performed stably.

Various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus for treating a substrate, comprising:
a plurality of transfer rollers configured to be rotated in order to transfer the substrate and simultaneously to wet a back surface of the substrate;
a plurality of chemical solution supply tanks configured to receive a chemical solution therein, the plurality of the chemical solution supply tanks arranged under the plurality of the transfer rollers, respectively, with being spaced apart a predetermined distance from each other;
a main tank configured to surround the plurality of the chemical solution supply tanks;
an exhaustion unit configured to suck and exhaust fume generated in the process of wetting the back surface with the chemical solution and liquid drops of the chemical solution;
a front tank installed adjacent to a side of the main tank to supply the chemical solution to each chemical solution supply tank, wherein the front tank rotatably supports each transfer roller; and
a chemical solution supply unit configured to supply the chemical solution to the front tank.

2. The apparatus for treating the substrate according to claim 1, wherein the exhaustion unit comprises a suction pipe that is open within the main tank, and
the suction pipe sucks the fume and the liquid drops via a space formed between each two neighboring chemical solution supply tanks.

3. The apparatus for treating the substrate according to claim 1, further comprising:
a rear tank installed adjacent to the other side of the main tank to receive the chemical solution supplied from the plurality of the chemical solution supply tanks, wherein the rear tank rotatably supports each transfer roller; and
a first chemical solution exhaustion unit configured to exhaust the chemical solution stored in the rear tank outside.

4. The apparatus for treating the substrate according to claim 3, wherein the chemical solution supply tanks, the main tank, the front tank and the rear tank are integrally formed with each other.

5. The apparatus for treating the substrate according to claim 3, wherein a plurality of chemical solution passages are formed in the rear tank to flow the chemical solution overflowing along longitudinal directions of the chemical solution supply tanks therethrouqh.

6. The apparatus for treating the substrate according to claim 1, further comprising:
a liquid level sensing unit arranged in the front tank to sense a liquid level within the chemical solution supply tanks, which are in fluid communication with the front tank.

7. The apparatus for treating the substrate according to claim 1, further comprising:
a driving unit configured to rotate the transfer rollers, the driving unit coupled to shafts of the transfer rollers formed through the front tank along a longitudinal direction of the transfer rollers.

8. The apparatus for treating the substrate according to claim 7, further comprising:
a sealing member arranged between the front tank and the driving unit to prevent the chemical solution from leaking to the driving unit.

9. The apparatus for treating the substrate according to claim 7, wherein a first bearing is provided between a first front lateral wall of the front tank arranged along a longitudinal direction of the shaft and the shaft, and
a second bearing is provided between a second front lateral wall of the front tank and the shaft.

10. The apparatus for treating the substrate according to claim 1, further comprising:
a second chemical solution exhaustion unit arranged under the main tank to exhaust the chemical solution drawn into the main tank after overflowing along a cross sectional direction of the chemical solution supply tanks.

11. The apparatus for treating the substrate according to claim 1, wherein a plurality of chemical solution supply holes are formed in the front tank, in communication with the plurality of the chemical solution supply tanks, respectively.

12. The apparatus for treating the substrate according to claim 1, wherein each transfer roller comprises, a roller body received in the respective chemical solution supply tank, in contact with the back surface of the substrate, and a shaft comprising a first shaft portion and a second shaft portion provided in both ends of the roller body to rotate the roller body, and
the first shaft portion comprises a first hollow shaft region arranged outside the respective chemical solution supply tank, with a hollow shape, and a first chemical solution inlet is formed in the first hollow shaft region to supply the chemical solution to the respective chemical solution supply tank.

13. The apparatus for treating the substrate according to claim 12, wherein a body hollow portion is formed in the roller body, in communication with the first hollow shaft region, and a plurality of body communication holes are formed in an outer surface of the roller body to connect the outer surface and the body hollow portion with each other.

14. The apparatus for treating the substrate according to claim 13, wherein the second shaft portion comprises a third hollow shaft region arranged outside the respective chemical solution supply tank, in communication with the body hollow portion, and a first chemical solution outlet is formed in the third hollow shaft region to exhaust the chemical solution from the respective chemical solution supply tank.

15. The apparatus for treating the substrate according to claim 12, further comprising:
- a third shaft portion extended from the first and second shaft portions, passing through the roller body, the third shaft portion formed in hollow shape, and
- a first communication hole in communication with the roller body is formed in the third shaft portion and a second communication hole in communication with the respective chemical solution supply tank is formed in an outer surface of the roller body.

16. The apparatus for treating the substrate according to claim 15, wherein the roller body has a cylindrical shape and one or more roller partition walls are installed in the roller body to reinforce the rigidity of the roller body.

17. The apparatus for treating the substrate according to claim 12, wherein the first shaft portion comprises a second hollow shaft region arranged in the respective chemical solution supply tank, with a hollow shape, and a second chemical solution inlet in communication with the respective chemical solution supply tank is formed in the second hollow shaft region and the roller body has a solid shaft shape which is not hollow.

18. An apparatus for treating a substrate, comprising:
- a plurality of transfer rollers configured to be rotated in order to transfer the substrate and simultaneously to wet a back surface of the substrate;
- a plurality of chemical solution supply tanks configured to receive a chemical solution therein, the plurality of the chemical solution supply tanks arranged under the plurality of the transfer rollers, respectively, with being spaced apart a predetermined distance from each other;
- a main tank configured to surround the plurality of the chemical solution supply tanks;
- a front tank adjacent to a side of the main tank to supply the chemical solution to each chemical solution supply tank, wherein the front tank rotatably supports each transfer roller; and
- a chemical solution supply unit configured to supply the chemical solution to the front tank, wherein the front tank and the chemical solution supply tanks are in communication with each other through a fluidic path formed in each transfer roller and the chemical solution contained in the front tank is supplied to the back surface of the substrate through the fluidic path formed in each transfer roller.

19. The apparatus for treating the substrate according to claim 18, wherein each transfer roller comprises a roller body received in the chemical solution supply tank, in contact with the back surface of the substrate and a shaft configured to rotate the roller body, and at least predetermined portion of the shaft is formed in a hollow shape to make the front tank in communication with the respective chemical solution supply tank.

* * * * *